(12) United States Patent
Kim et al.

(10) Patent No.: US 7,335,916 B2
(45) Date of Patent: Feb. 26, 2008

(54) ELECTRODE STRUCTURE, AND SEMICONDUCTOR LIGHT-EMITTING DEVICE HAVING THE SAME

(75) Inventors: Hyun-soo Kim, Gyeonggi-do (KR); Jae-hee Cho, Yongin-si (KR); Suk-ho Yoon, Seoul (KR)

(73) Assignee: Samsung Electro-Mechanics Co., Ltd., Suwon-Si, Gyeonggi-Do (KR)

( * ) Notice: Subject to any disclaimer, the term of this patent is extended or adjusted under 35 U.S.C. 154(b) by 103 days.

(21) Appl. No.: 11/412,838

(22) Filed: Apr. 28, 2006

(65) Prior Publication Data

US 2006/0255342 A1 Nov. 16, 2006

Related U.S. Application Data

(63) Continuation-in-part of application No. 10/852,151, filed on May 25, 2004, now abandoned.

(30) Foreign Application Priority Data

Oct. 27, 2003 (KR) ............................... 2003-75220

(51) Int. Cl.
*H01L 29/22* (2006.01)
*H01L 29/24* (2006.01)

(52) U.S. Cl. ............................ 257/70; 257/99; 257/81; 257/98; 257/100; 257/91; 257/778; 257/E33.062; 257/E33.072

(58) Field of Classification Search ................ 257/99, 257/81, 98, 100, 91, 778, E33.062, E33.072
See application file for complete search history.

(56) References Cited

U.S. PATENT DOCUMENTS

| 6,445,011 B1 | 9/2002 | Hirano et al. |
| 6,936,859 B1 | 8/2005 | Uemura et al. |
| 2002/0123164 A1* | 9/2002 | Slater et al. .................. 438/39 |

FOREIGN PATENT DOCUMENTS

KR 1999-88218 A 12/1999

OTHER PUBLICATIONS

Official Action issued by the Korean Intellectual Property Office in corresponding Korean Application No. 2003-0075220 on Feb. 1, 2007.
Official Action issued by the Chinese Intellectual Property Office in corresponding Chinese Patent Application No. 200410048443.4, Jun. 15, 2007; and English translation thereof.

* cited by examiner

*Primary Examiner*—Kenneth Parker
*Assistant Examiner*—Joseph Nguyen
(74) *Attorney, Agent, or Firm*—Buchanan Ingersoll & Rooney PC

(57) ABSTRACT

A semiconductor light emitting device comprising: a transparent substrate; an electron injection layer of N-type GaN-based semiconductor; an active layer on the electron injection layer; a hole injection layer of P-type GaN-based semiconductor on the active layer; a first electrode structure on the hole injection layer; a second electrode structure on the electron injection layer; and a circuit substrate flip-chip bonded with the electrode structures, wherein the first electrode structure comprises a contact metal structure which is mesh- or island-shaped on the hole injection layer to expose a surface portion of the hole injection layer, and a reflective layer which covers the contact metal structure and the exposed surface portion of the hole injection layer, at least an upper portion of the reflective layer being made of silver (Ag) or aluminum (Al), an area ratio of the contact metal structure to the first electrode structure satisfies a following inequality: $0.4 \leq A_{pd}/A_{total} < 1$.

20 Claims, 9 Drawing Sheets

ELECTRODE STRUCTURE, AND SEMICONDUCTOR LIGHT-EMITTING DEVICE HAVING THE SAME

This is a continuation-in-part of U.S. patent application Ser. No. 10/852,151, filed Mar. 25, 2004, now abandoned and claims the priority of Korean Patent Application No. 2003-75220, filed on Oct. 27, 2003, on the Korean Intellectual Property Office, the disclosure of which is incorporated herein in its entirety by reference.

BACKGROUND OF THE INVENTION

1. Filed of the Invention

The present invention relates to a semiconductor light-emitting device using a nitride semiconductor or a like material, and more particularly, to a high reflective electrode structure concurrently satisfying a low contact resistance and a high reflectivity, and a flip-chip light-emitting device having the same.

2. Description of the Related Art

A nitride-based or GaN-based compound semiconductor, which is generally used for a visible light emitting device, is advanced to emit light in an ultraviolet light region for a white LED as well as visible light regions of blue and green. The nitride-based compound semiconductor is mainly classified into 1) a structure of extracting an upward light from the active layer, and 2) a structure of extracting a downward light passing through a transparent substrate such as a sapphire substrate.

In a flip-chip light emitting device having the structure of extracting light through the transparent substrate, reflectivity at an interface of a P-type electrode is of importance to reflect the upward light to direct downward.

In the meantime, it is advantageous that a light emitting device has a low operation voltage. At present, the most general method for lowering an operation voltage of the light emitting device involves decreasing resistance of a material layer formed between an electrode layer and an active layer. Especially, since a hole injection layer (that is, P-type semiconductor layer) and a P-type electrode are in Ohmic contact to each other in the flip-chip light emitting device, it is very desirable that the hole injection layer and P-type electrode have low Ohmic contact resistance formed therebetween so as to reduce the operation voltage.

FIG. 1 is a schematic sectional view illustrating a conventional flip-chip nitride semiconductor light-emitting device.

As illustrated in FIG. 1, the conventional flip-chip nitride semiconductor light emitting device 10 includes a sapphire substrate 11, an N-type GaN layer 12, an active layer 16 formed of InGaN, a P-type GaN layer 18, a nickel layer 20, a P-type reflective electrode 22 sequentially formed on the sapphire substrate 11, and an N-type electrode 14 formed on one side surface of the N-type GaN layer 12. The light emitting device 10 has a dual hetero-junction structure where the N-type GaN layer 12 functions as a cladding layer for a first conductive type, and the P-type GaN layer 18 functions as a cladding layer for a second conductive type.

Further, the nickel layer 20 is formed on the P-type GaN layer 18 to have a thickness of below about 10 nm, and functions as a contact metal layer for forming the Ohmic contact. Since the P-type reflective electrode 22 is formed of aluminum (Al) or silver (Ag), light transmitting the nickel layer 20 that is the contact metal is reflected at an interface between the P-type reflective electrode 22 and the nickel layer 20.

The conventional light emitting device may extract light without the nickel layer 20, using the P-type reflective layer 22 of material such as aluminum (Al) or silver (Ag) with a high reflectivity, and can achieve a high efficiency of light extraction. However, in case that the P-type reflective electrode 22 is directly formed on the P-type GaN layer 18 without the nickel layer 20 therebetween, the contact resistance is increased considerably. Accordingly, it is desirable that the contact metal layer 20 be formed on the P-type GaN layer 18 for forming the Ohmic contact, thereby reducing the contact resistance.

However, in the flip-chip nitride semiconductor light emitting device 10 having the nickel layer 20 as the contact metal, since light emitted from the active layer 16 formed passes through the nickel layer 20, and then is reflected at the interface between the nickel layer 20 and the P-type reflective electrode 22, and then again passes through the nickel layer 20 and the sapphire substrate 11 for extraction, a large amount of light is absorbed by the nickel layer 20. Therefore, the conventional flip-chip nitride semiconductor light emitting device 10 has a drawback in that it is very difficult to increase the reflectivity.

Since the nickel layer 20, which is the contact metal, is used to be in reliable contact with the P-type GaN layer 18, the thicker nickel layer 20 can provide a better contact with the P-type GaN layer 18. However, if the nickel layer 20 has a thickness of above 10 nm, it is difficult to have enough reflectivity.

Accordingly, the semiconductor light emitting device is required to have a reflection structure for maintaining the high reflectivity while maintaining the low contact resistance.

SUMMARY OF THE INVENTION

The present invention provides a semiconductor light emitting device having a P-type electrode structure concurrently satisfying a low contact resistance and a high reflectivity.

Further, the present invention provides an electrode structure concurrently satisfying a low contact resistance and a high reflectivity in a semiconductor light emitting device.

According to an aspect of the present invention, there is provided a semiconductor light emitting device comprising: a transparent substrate; an electrode injection layer which is formed on the transparent substrate and formed of N-type GaN-based semiconductor; an active layer which is formed on a first region of the electron injection layer; a hole injection layer which is formed on the active layer and formed of P-type GaN-based semiconductor; a first electrode structure which is formed on the hole injection layer and concurrently provides a high reflectivity and a low contact resistance; a second electrode structure which is formed on a second region of the electron injection layer; and a circuit substrate which is electrically connected with the first and second electrode structures. The first electrode structure comprises: a contact metal structure which is mesh-shaped or island-shaped on the hole injection layer to expose a surface portion of the hole injection layer; and a reflective layer which covers the contact metal structure and the exposed surface portion of the hole injection layer. In particular, an area ratio of the contact metal structure to the first electrode structure satisfies a following relation: $0.4 \leq A_{pd}/A_{total} < 1$, where $A_{pd}$ is the surface area of the contact metal structure contacting the hole injection layer, and $A_{total}$ is the entire area of the first electrode structure contacting the hole injection layer. The semiconductor light emitting device is a flip-chip device, that is, the first and second electrode structures are flip-chip bonded to the circuit substrate to extract light through the transparent substrate.

According to another aspect of the present invention, there is provided an electrode structure used in a flip-chip GaN-based semiconductor light emitting device having an active layer and a hole injection layer formed on the active layer, the electrode structure being formed on the hole injection layer. The electrode structure comprises: a contact metal structure which is mesh or island-shaped on the hole injection layer to expose a surface portion of the hole injection layer; and a reflective layer which covers the contact metal structure and the exposed surface portion of the hole injection layer, at least an upper portion of the reflective layer being made of Ag or Al. In particular, an area ratio of the contact metal structure to the first electrode structure satisfies a following inequality: $0.4 \leq A_{pd}/A_{total} < 1$, where $A_{pd}$ is the surface area of the contact metal structure contacting the hole injection layer, and $A_{total}$ is the entire area of the first electrode structure contacting the hole injection layer.

Preferably, the area ratio satisfies an inequality of $0.4 \leq A_{pd}/A_{total} \leq 0.9$. Preferably, the thickness of the contact metal structure is less than 200 nm. The hole injection layer may be formed of P-type GaN. Preferably, the contact metal structure may be made of palladium (Pd).

According to one embodiment, the reflective layer is made of Ag or Al. In this embodiment, the Ag or Al reflective layer may be in direct contact with the exposed surface portion of the hole injection layer.

According to another embodiment, the reflective layer comprises: a dielectric layer formed on the exposed surface portion of the hole injection layer; and a reflective metal layer made of Ag or Al which covers the contact metal structure and the dielectric layer. Preferably, the thickness of the dielectric layer is $\lambda/(4n)$, where $\lambda$ is a wavelength of light emitted from the light emitting device and n is a refractive index of the dielectric layer. The refractive index of the dielectric layer is preferably from 1.1 to 2.3. The dielectric layer can be made of $SiO_2$ or $Si_3N_4$.

In an embodiment, the electron injection layer may be formed of N-type GaN, the active layer may be formed of InGaN, and the hole injection layer may be formed of P-type GaN. In the specification, 'GaN-based semiconductor' designates a binary, ternary or quaternary compound semiconductor having a composition expressed by $Al_xGa_yIn_{1-x-y}N$, where $0 \leq x \leq 1$, $0 \leq y \leq 1$, and $0 \leq x+y \leq 1$. Also, 'a GaN-based Semiconductor light emitting device' means that an electron injection layer, active layer and hole injection layer constituting a light emitting structure are made of GaN-based semiconductor.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
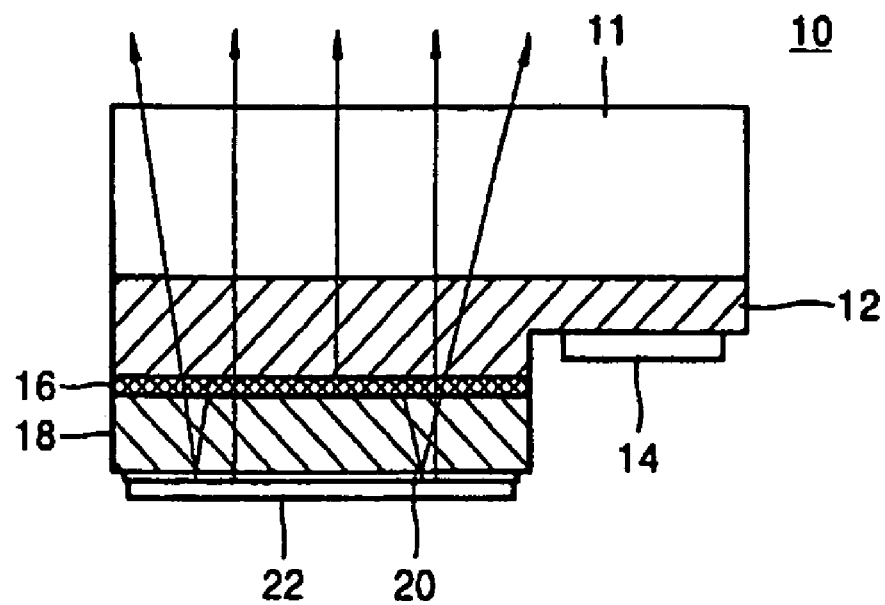
FIG. 1 is a schematic sectional view illustrating a conventional nitride semiconductor light emitting device.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. It will also be understood that when a layer is referred to as being "on" another layer or substrate, it can directly on the other layer or substrate, or intervening layers may also be present.

Figure 2:
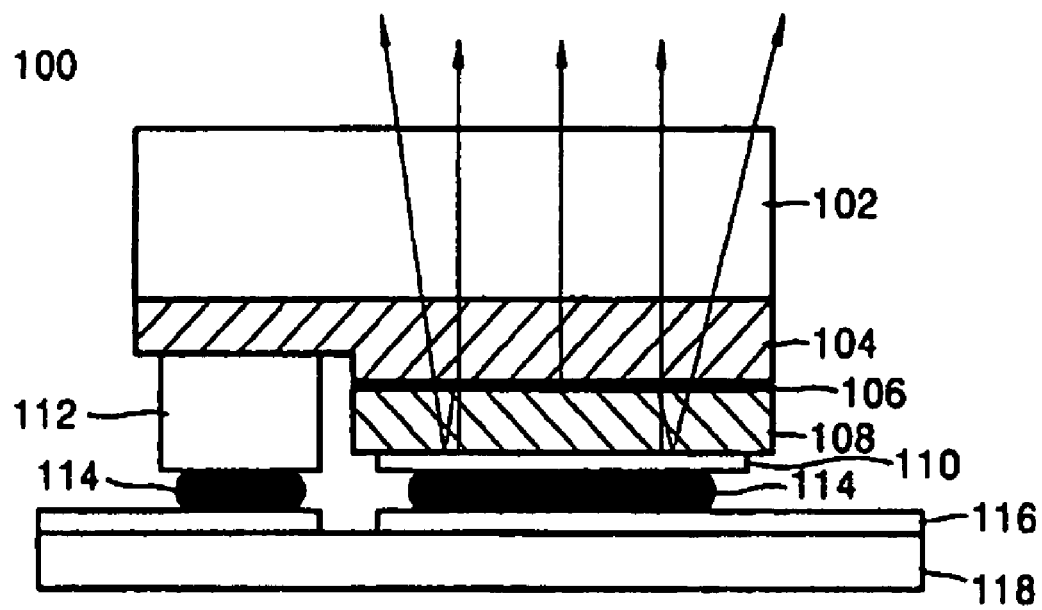
FIG. 2 is a sectional view illustrating a semiconductor light emitting device according to a preferred embodiment of the present invention.

FIG. 2 is a sectional view illustrating a semiconductor light emitting device according to a preferred embodiment of the present invention.

As shown in FIG. 2, the semiconductor light emitting device 100 includes a transparent substrate 102 formed of transparent material such as sapphire ($Al_2O_3$) or silicon carbide (SiC); an electron injection layer 104 formed of an N-type GaN on the transparent on the transparent substrate 102; an active layer 106 formed of InGaN; and a hole injection layer 108 formed of a P-type GaN. The electron injection layer 104 includes a first portion and a second portion, and step-shaped with the first portion thicker than a second portion. The active region 106 and the hole injection layer 108 are formed on the second portion of the electron injection layer.

The semiconductor light emitting device 100 further includes a P-type electrode structure 110 functioning as a contact electrode and reflector formed on the hole injection layer 108. The P-type electrode 110 includes a contact metal structure functioning as a contact metal forming Ohmic contact to reduce contact resistance; and a reflective layer. The contact metal structure may be made of metal such as palladium (Pd) having good contact resistance property with P-type GaN-based semiconductor. Preferably, the thickness of the contact metal structure is less than 200 nm so as to prevent light absorption in the contact metal. The reflective layer may be formed of metal such as silver (Ag) or aluminum (Al) with the high reflectivity. Alternatively, the reflective layer may have a 2 (or more)-layered structure including a metal layer and a dielectric film.

Figure 3A:
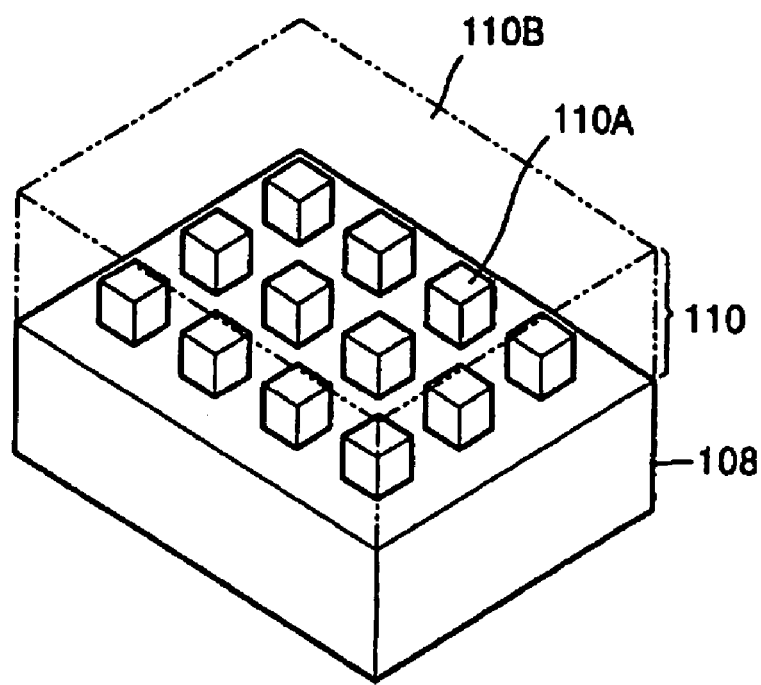
FIGS. 3A and 3B are perspective views illustrating P-type electrode structures used in a semiconductor light emitting device of FIG. 2 according to embodiments of the present invention.
Figure 3B:
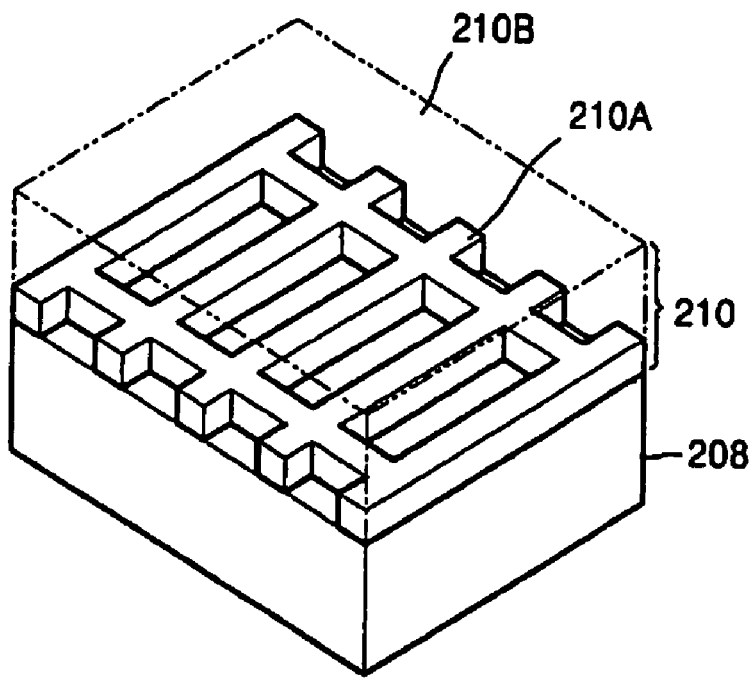
Figure 3C:
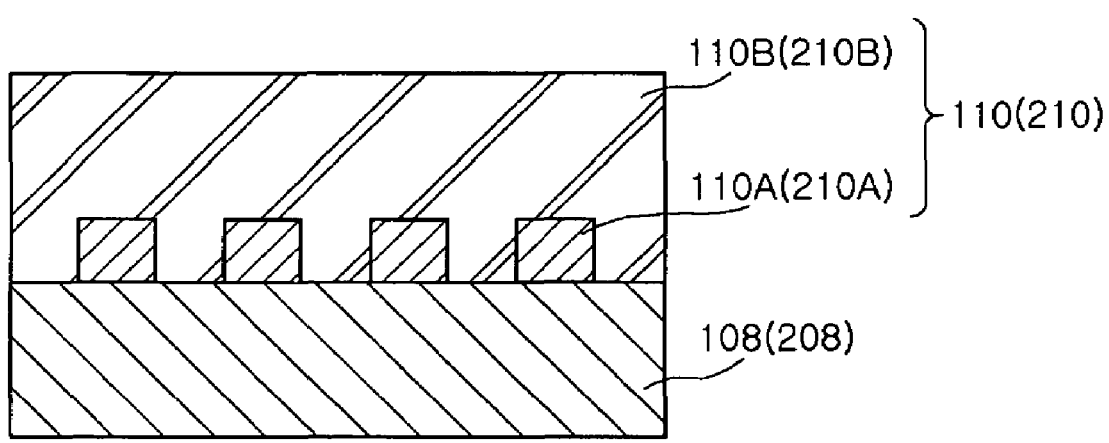
FIG. 3C is a sectional view illustrating the electrode structure of FIG. 3A or 3B.

FIGS. 3A and 3B are perspective views illustrating P-type electrode structures which can be used in the semiconductor light emitting device of FIG. 2 according to embodiments of the present invention. FIG. 3C is a sectional view of the P-type electrode structure shown in FIG. 3A or 3B.

Referring to first to FIG. 3A, the P-type electrode structure 110 according to a first embodiment present invention is formed on the hole injection layer 108, and includes a contact metal structure 110A that functions as a contact metal forming the Ohmic contact to reduce the contact resistance; and a reflective layer 110B that functions as a reflector for reflecting light toward the transparent substrate 102. The contact metal structure 110A is formed of palladium (Pd) that has a low contact resistance. The reflective layer 110B is formed of metal having the high reflectivity such as aluminum (Al) or silver (Ag).

Further, the P-type electrode structure 110 according to a preferred embodiment of the present invention performs a function of uniformly distributing current, which is applied from a circuit board, over the hole injection layer 108, as well as a function of contact.

In the active layer 106, electrons injected from the electron injection layer 104 are combined with holes injected from the hole injection layer 108. The combined electrons and holes fall to a low energy band to cause light emission. At this time, the emitted light is reflected at an interface between the reflective layer 110B and the contact metal structure 110A, and at an interface between the reflective layer 110B and the hole injection layer 108. The reflected light sequentially goes through the hole injection layer 108, the active layer 106, the electron injection layer 104 and the transparent substrate 102 while emitting in the direction of an arrow FIG. 2.

The contact metal structure 110A is island-shaped, and the reflective layer 110B of Ag or Al covers the resultants including the hole injection layer 108 and the contact metal structure 10A. Though the contact metal structure 110A is rectangular island-shaped, it can have other shapes such as a semispherical shape or a regular-tetrahedron within a scope or spirit of the present invention.

Referring to FIG. 3B, a P-type electrode structure 210 according to a second embodiment of the present invention is formed on the hole injection layer 208, and includes a contact metal structure 210A that function as the contact metal forming the Ohmic contact to reduce the contact resistance; and a reflective layer 210B. The reflective layer 210B is formed of metal having the high reflectivity such as aluminum (Al) or silver (Ag).

The contact metal structure 210A is mesh-shaped, and the reflective layer 210B of Ag or Al covers the resultants including the hole injection layer 208 and the contact metal structure 210A. Though the mesh-shaped contact metal structure 210A has a square bar shape, it can have other shapes such as a cylindrical shape or a rectangular shape within a scope or spirit of the present invention.

As shown in FIGS. 3A and 3B (or FIG. 3C), the island-patterned or mesh-patterned contact metal structure 110A or 210A) is formed on the hole injection layer 108 or 208 to expose a surface portion of the hole injection layer 108 or 208. The reflective layer 110B or 210B covers the contact metal structure 110A, 210A and the exposed surface portion of the hole injection layer 108, 208.

Referring again to FIG. 2, an N-type electrode 112 is formed on the thinner first portion of the electron injection layer 104. The N-type electrode 112 can be also formed to have an electrode structure such as Ti/Al/Pt/Au in which metals are deposited. As described above, after semiconductor light-emitting parts 104, 106, 108 and 110 are formed on the transparent substrate 102, the resultant transparent substrate 102 is aligned on a sub-mount or circuit substrate 118 having and Au layer 116 and solder ball 114 formed on the Au layer 116. The Au layer 116 is wire-shaped such as a lead frame.

Next, flip-chip bonding is performed to assemble the semiconductor light-emitting parts onto the sub-mount 118, so that the semiconductor light-emitting device 100 is completed. Though not illustrated in detail in the drawings, a process of forming a bonding metal for bonding the P-type electrode structure 110 and the N-type electrode 112 with the sub-mount 118 can be additionally performed.

FIG. 4A through 4F are plane views illustrating P-type electrode structures depending on varied area ratios of a palladium (Pd) layer to a P-type electrode structure.

FIG. 4A through 4F illustrate a contact metal layer formed of palladium (Pd) that is formed to have a thickness of about 1 nm (10 Å) on the hole injection layer. This represents experimental results of the electrode structures where the area ratios of the Pd layer to the P-type electrode structure are varied going from FIG. 4A to FIG. 4F so as to describe the effect of the present invention.

Figure 4A:
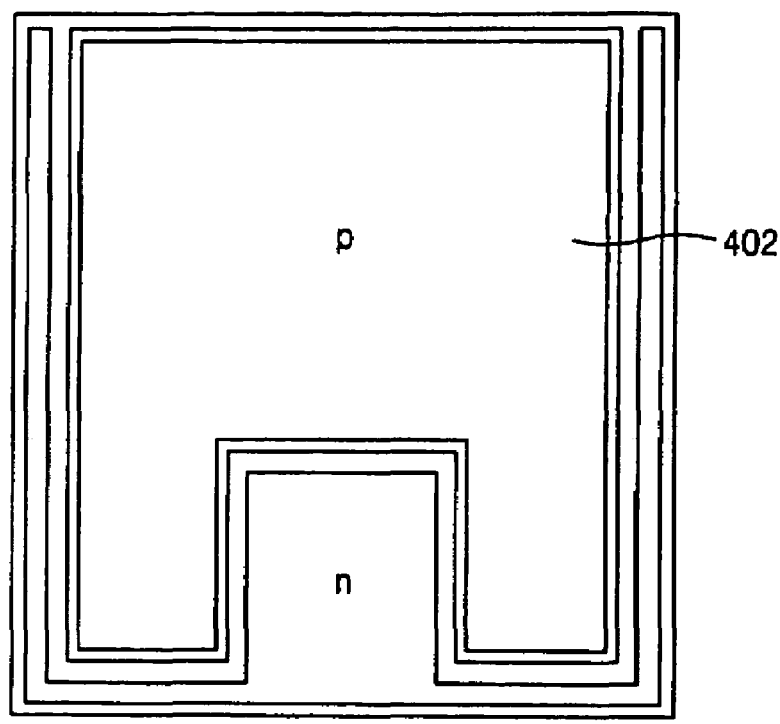
FIGS. 4A through 4F are plane views illustrating P-type electrode structures depending on varied area ratios of a palladium layer to a P-type electrode structure.

Describing in detail, in FIG. 4A, the entire area denoted by 402 are covered with the Pd layer as a contact metal with a thickness of about 10 Å. Further, an Ag layer as a reflective layer with a thickness of about 2000 Å is formed on the Pd layer. Therefore, the P-type electrode structure in FIG. 1A is a simple 2-layered metal structure, that is, simple Pd/Ag structure (the contact metal layer in FIG. 4A is not mesh-patterned). In the embodiment of FIG. 4A, an area ratio $(A_{pd}/A_{total})$ of the contact metal structure (Pd) to the P-type electrode structure (Pd/Ag) is 1 (100%), where $A_{pd}$ is the surface area of the contact metal structure contacting the hole injection layer, and $A_{total}$ is the entire area of the P-type electrode structure contacting the hole injection layer. The Pd mesh coverage ratio in FIGS. 5A and 5B corresponds to the area ratio $(A_{pd}/A_{total})$.

Figure 4B:
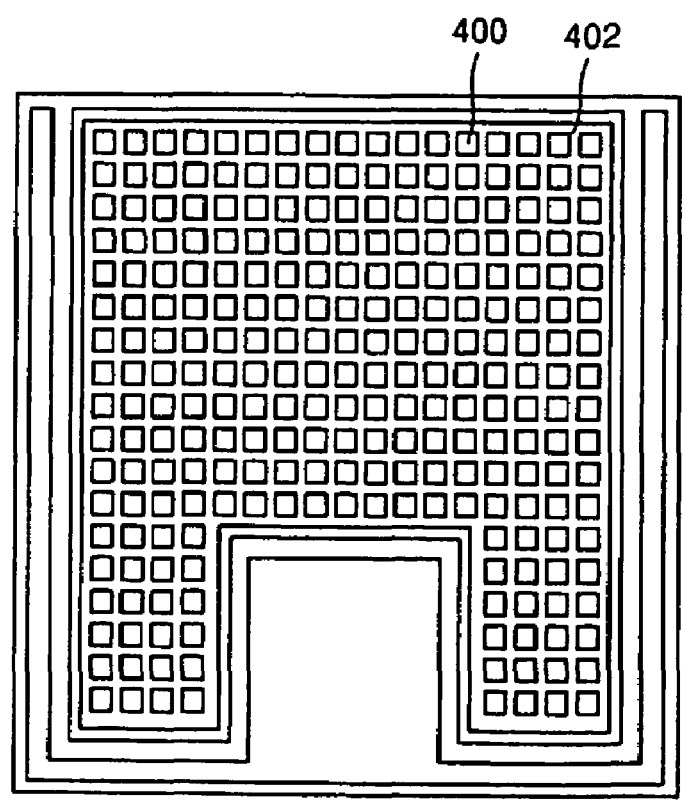
Figure 4C:
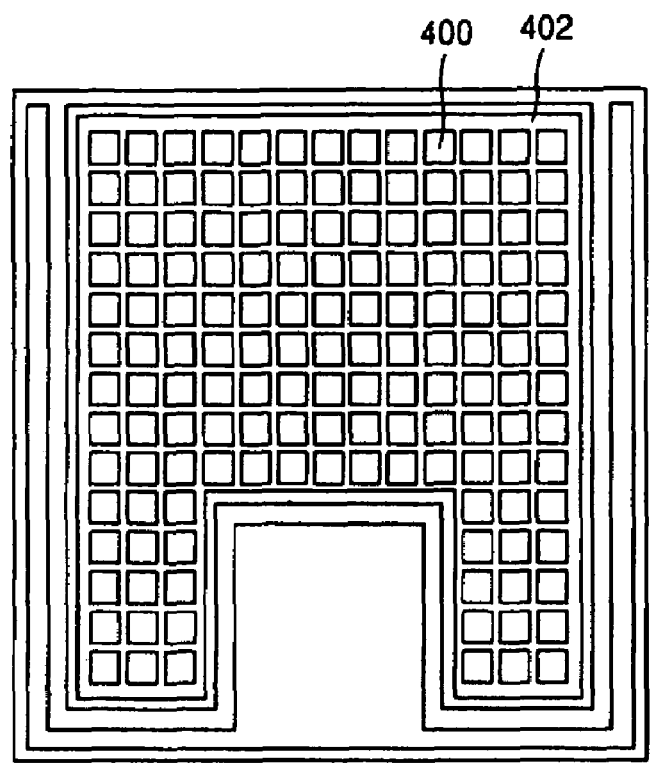
Figure 4D:
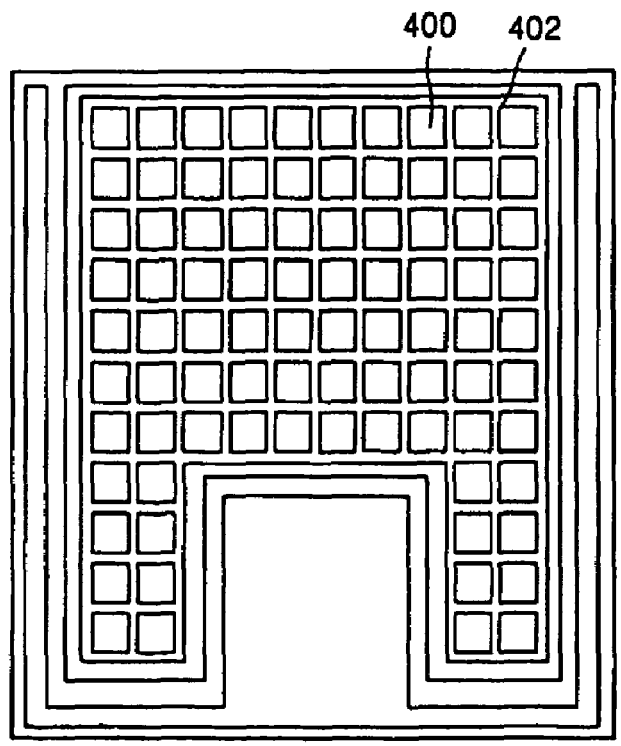
Figure 4E:
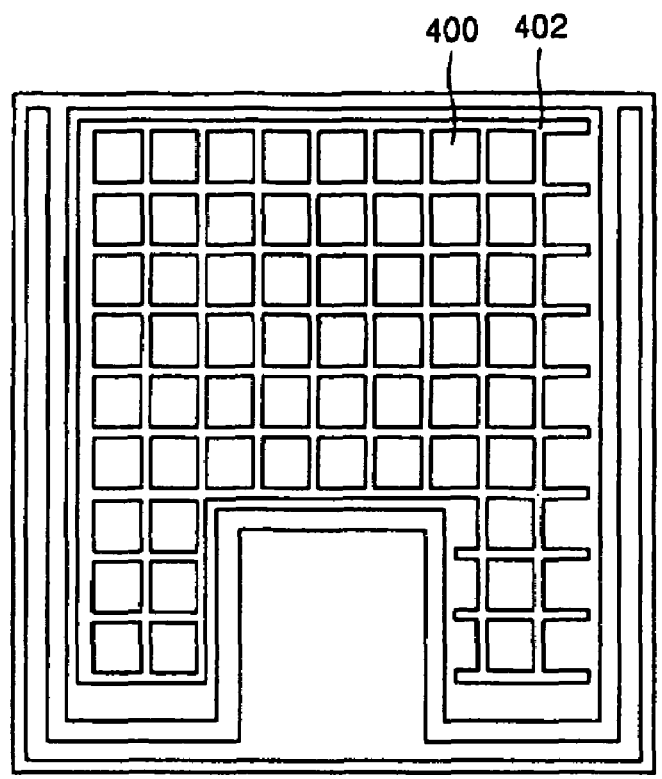

In FIG. 4B though 4E, regions 402 respectively correspond to the Pd layer. The P-type electrode structures of FIG. 4B through 4E is designated as mesh_1 to mesh_4, respectively, for convenience's sake. As shown in the drawings, the Pd layers of mesh_1 to mesh_4 (FIGS. 4B through 4E) are mesh-patterned. The Pd layers have a thickness of about 10 Å. Here, a reference numeral 400 denotes the surface portion of the hole injection layer exposed by the Pd mesh-pattern. A reference numeral 402 denotes the Pd mesh-pattern region (the contact metal layer region). The Ag layer covers the exposed surface portion 400 of the hole injection layer and the Pd layer. The Ag layers have a thickness of about 2000 Å. Each area ratio $(A_{pd}/A_{total})$ of the Pd layer to the entire P-type electrode structure (Pd/Ag layer) in mesh_1 to meshed_4 is 0.63, 0.39, 0.28 and 0.22 respectively.

Figure 4F:
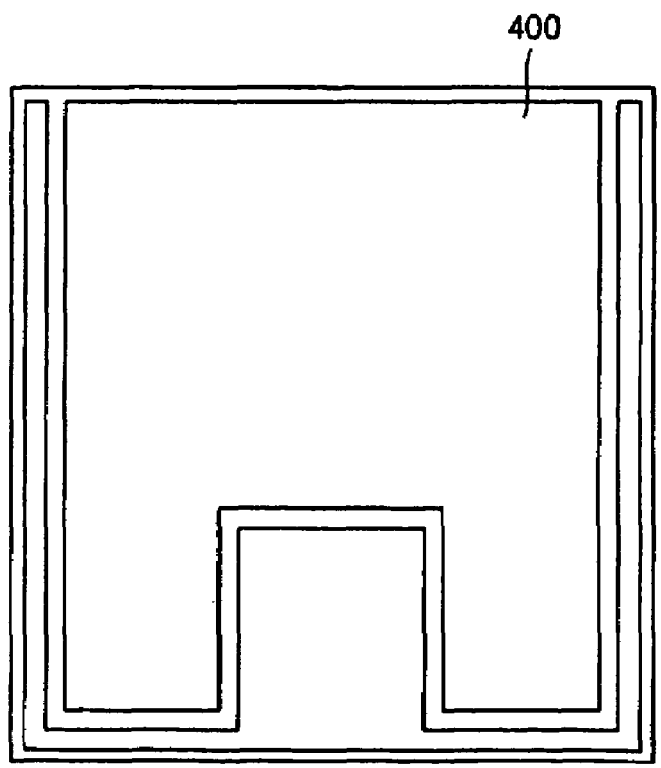

In FIG. 4F, only a Ag layer of about 2000 Å thickness is formed without the Pd layer. Therefore, the area ration $(A_{pd}/A_{total})$ of the Pd layer to the entire P-type electrode structure is 0 (0%).

Figure 5A:
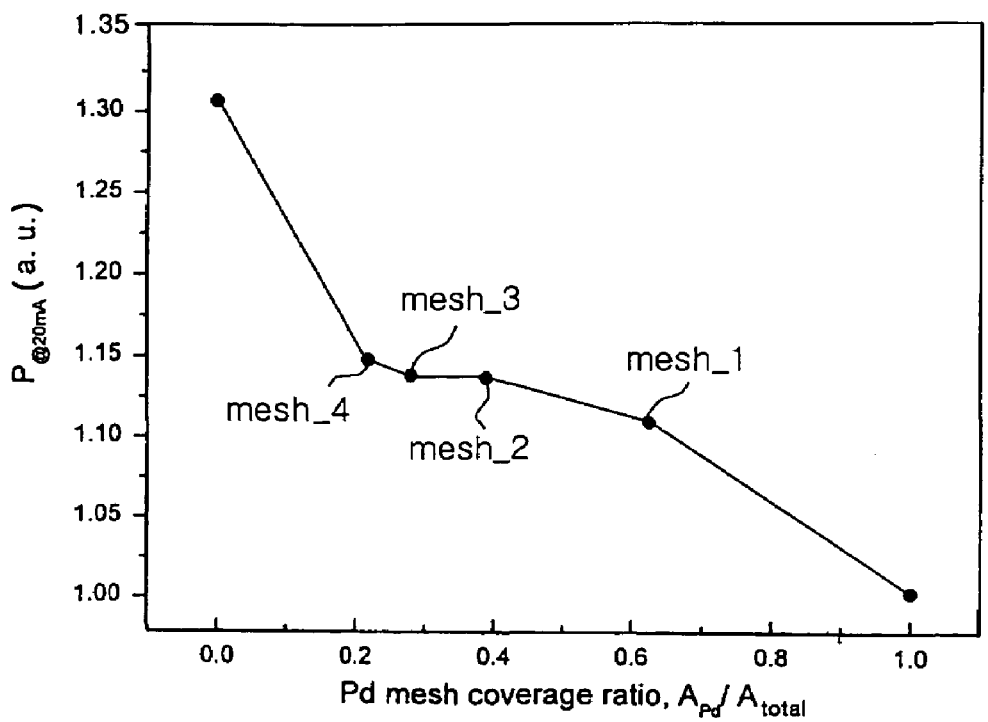
FIG. 5A is a graph showing the correlation between light output power and Pd mesh coverage ratios ($A_{pd}/A_{total}$) in FIGS. 4A through 4F.

FIG. 5A is a graph showing the correlation between light output power (P) and Pd mesh coverage ratios $(A_{pd}/A_{total})$ in FIGS. 4A through 4F, and FIG. 5B is a graph showing the correlation between operation voltage $(V_F)$ and the Pd mesh coverage ratios $(A_{pd}/A_{total})$.

As shown in the FIG. 5A, it can be appreciated that light output power (luminance) is lowest in the simple 2-layered electrode structure (FIG. 4A) with the Pd layer being entirely formed as the contact metal layer and then, the Ag layer being entirely formed on the Pd layer. As described above, this phenomenon occurs because light emitting from the active layer is reflected at an interface between the Pd layer and the Ag layer such that the reflected light emits toward the transparent substrate, thereby being much absorbed in the Pd layer.

As shown in FIG. 5A, when the electrode structure employs the Ag layer covering the Pd layer and the exposed surface portion of the hole injection layer as well as the Pd layer, luminance is improved. Further, as the area ratio ($A_{pd}/A_{total}$) of the Pd layer to the entire electrode structure is decrease, the luminance is increased. The simple 2-layered electrode structure (FIG. 4A) has the lowest luminance, and the electrode structure with only the Ag layer (FIG. 4F) has the highest luminance.

Figure 5B:
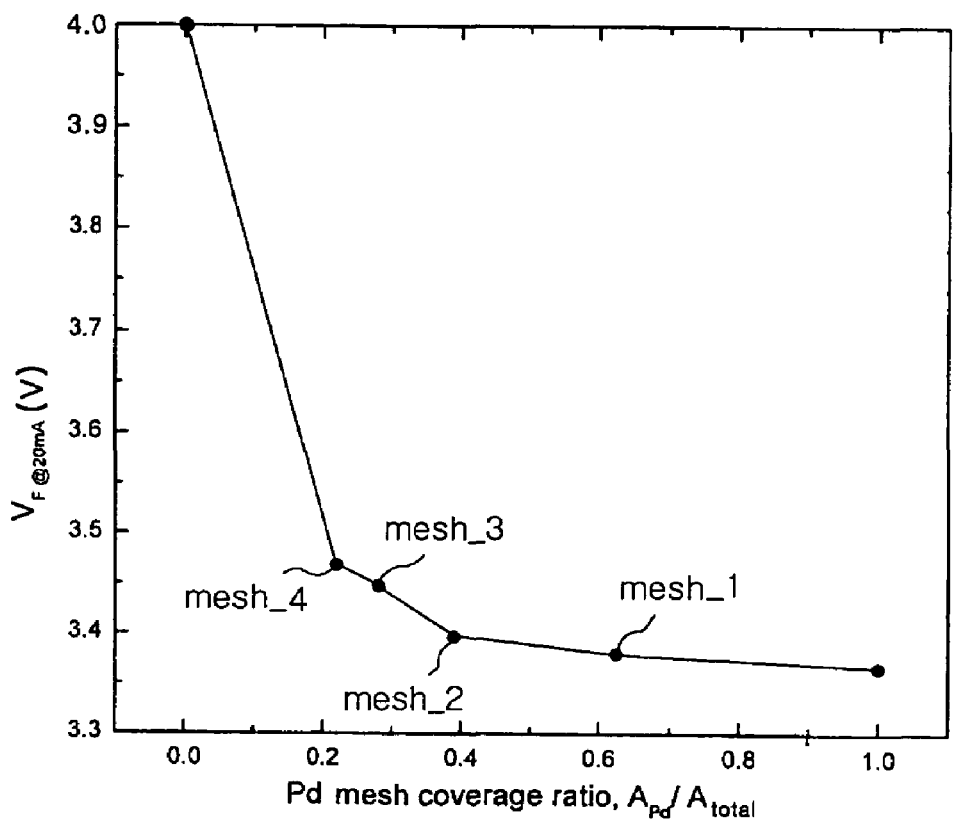
FIG. 5B is a graph showing the correlation between operation voltage and the Pd mesh coverage ratios ($A_{pd}/A_{total}$).

The electrode structure having only the Ag layer without the Pd layer has the highest luminance in the light emitting, but has the operation voltage exceeding 4.0V as shown in FIG. 5B. Accordingly, the electrode structure has the operation voltage greatly exceeding 3.80V. This is because the contact resistance is increased in the electrode structure with only the Ag layer.

However, when the electrode structure employs the combination of the mesh-patterned Pd layer and the Ag layer according to a preferred embodiment of the present invention, the electrode structure has the operation voltage that is not so large in comparison with the conventional electrode structure while providing the high reflectivity such that the light emission of the light emitting device can be maintained. Further, the present invention can change the area ratio ($A_{pd}/A_{total}$) to control the operation voltage and the reflectivity of P-type electrode structure, thereby optimizing light efficiency of the light emitting device.

The light output power and operation voltage data in FIGS. 5A and 5B are listed in Table 1 below.

TABLE 1

| sample | Area ratio ($A_{pd}/A_{total}$) | Light output power at 20 mA (a.u.) | Operation voltage at 20 mA (V) |
| --- | --- | --- | --- |
| Simply 2-layered (Pd/Ag) | 1 | 1 | 3.36 |
| Mesh_1 | 0.63 | 1.0795 | 3.38 |
| Mesh_2 | 0.39 | 1.1325 | 3.39 |
| Mesh_3 | 0.28 | 1.1296 | 3.44 |
| Mesh_4 | 0.22 | 1.1452 | 3.46 |
| Only Ag (without Pd) | 0 | 1.3128 | 4.02 |

As shown in Table 1, when the area ratio ($A_{pd}/A_{total}$) is 0.39, the operation voltage is about 3.4 V. Further, referring to FIG. 5B, the operation voltage does not significantly increase up to the area ration ($A_{pd}/A_{total}$) of about 0.4. If the area ratio is below 0.4, the operation voltage is increase sharply. Therefore, the area ratio ($A_{pd}/A_{total}$) should be about 0.4 or more in order to prevent a high operation voltage. Preferably, the area ratio ($A_{pd}/A_{total}$) is 0.9 or less in order to get enough luminance improvement. Most preferably, the area ratio ($A_{pd}/A_{total}$) is from 0.4 to 0.6. As shown in FIGS. 5A and 5B, we can improve the light output power by 13% (at the area of about 0.4) without significant increase in contact resistance.

As described above, the present invention has an effect in that light absorption made by the contact metal layer can be reduced while light efficiency of the semiconductor light emitting device can be improved, by controlling the area of the contact metal layer that is in contact with the hole injection layer formed of the P-type semiconductor.

Figure 6:
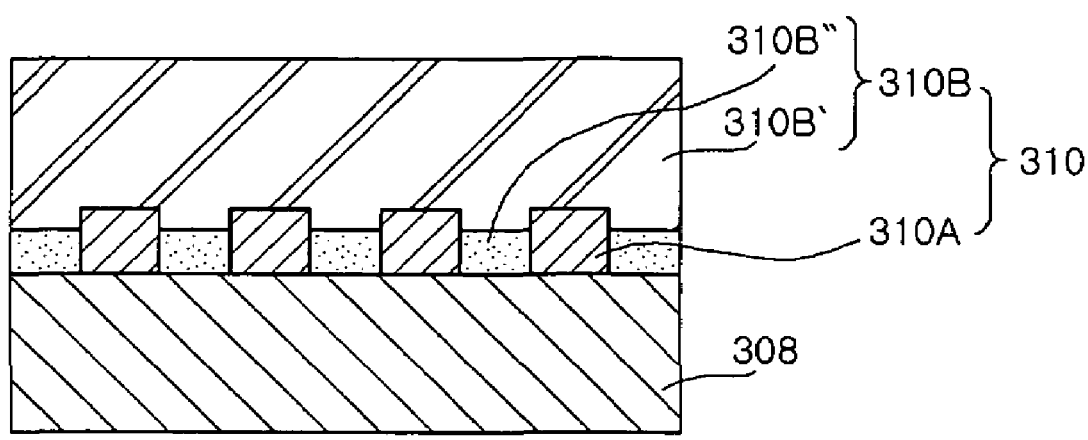
FIG. 6 is a sectional view illustrating a P-type electrode structure according to another embodiment of the present invention.

FIG. 6 is a sectional view illustrating a P-type electrode structure 310 according to another embodiment of the present invention. In this embodiment, the reflective layer 310B comprises a dielectric layer 310B" formed on the exposed surface portion of the hole injection layer 308; and a reflective metal layer 310B' of Ag or Al. the reflective metal layer 310B' covers the meshed or island-shaped Pd layer (contact metal structure) 310A and the dielectric layer 310B". Preferably, the thickness of the dielectric layer 310B" is λ/(4n), where λ is a wavelength of light emitted from the light emitting device and n is a refractive index of the dielectric layer 310B". The refractive index of the dielectric layer 310B" is preferably from 1.1 to 2.3. The dielectric layer 310B" is preferably made of $SiO_2$ or $Si_3N_4$. The dielectric layer 310B" may have a muti-layered structure, for example a mutilayer formed by stacking dielectric layers of different refractive indexes.

Figure 7A:
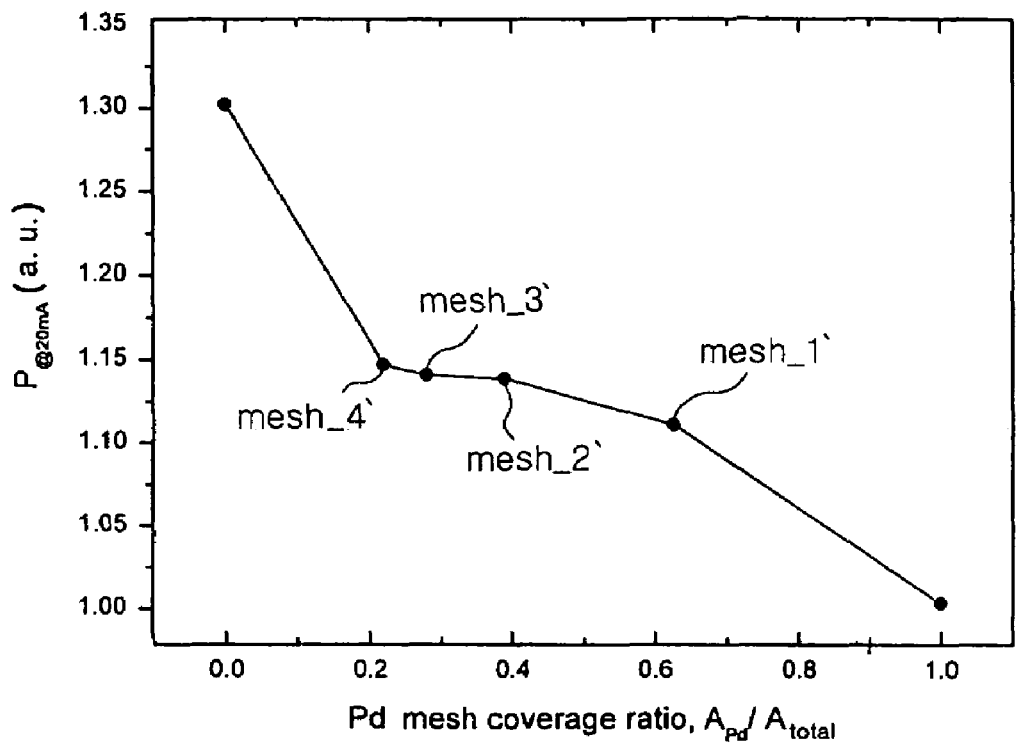
FIGS. 7A and 7B are graphs showing light output and operation voltage depending on Pd mesh coverage ratio ($A_{pd}/A_{total}$) in P-type electrode structures according to another embodiment, respectively.
Figure 7B:
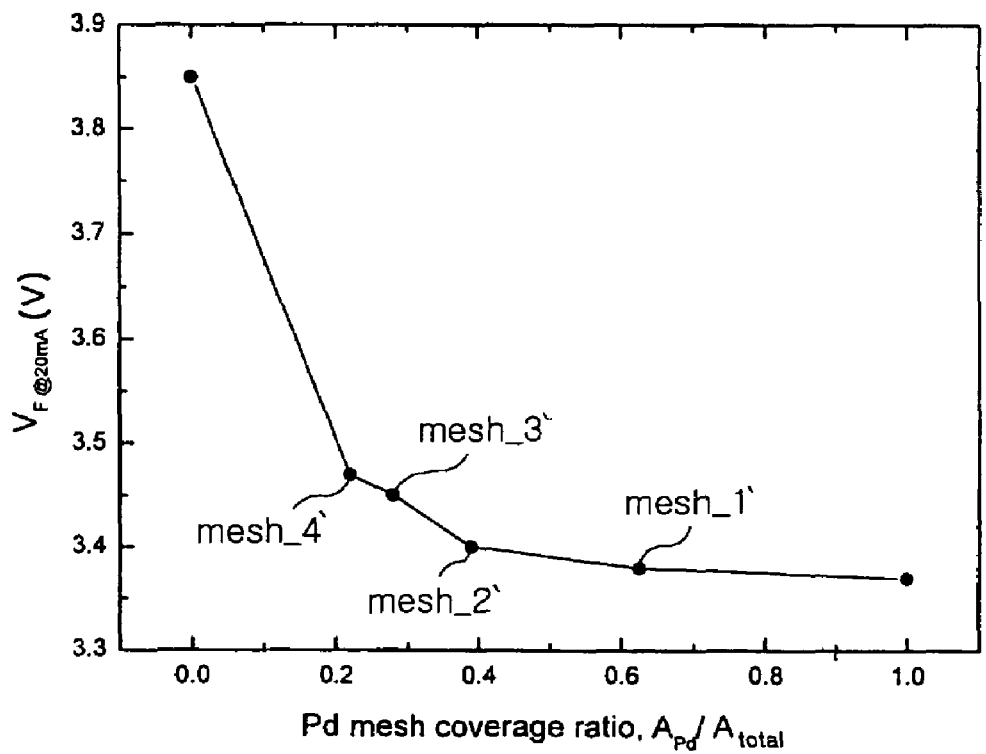

FIGS. 7A and 7B are graphs showing light output (P) and operation voltage (VF) depending on Pd mesh coverage ratio ($A_{pd}/A_{total}$) in P-type electrode structures according to the embodiment of FIG. 6, respectively. In FIGS. 7A and 7B, the thickness of the meshed Pd layer is 10 Å, and the thickness of the $SiO_2$ dielectric layer is 1000 Å. The thickness of the Ag reflective metal layer is 2000 Å. The data shown in FIGS. 7A and 7B is listed in Table 2, below.

TABLE 2

| sample | Area ratio ($A_{pd}/A_{total}$) | Light output power at 20 mA (a.u.) | Operation voltage at 20 mA (V) |
| --- | --- | --- | --- |
| Simply 3-layered (Pd/SiO$_2$/Ag) | 1 | 1 | 3.37 |
| Mesh_1' | 0.63 | 1.0796 | 3.38 |
| Mesh_2' | 0.39 | 1.1355 | 3.4 |
| Mesh_3' | 0.28 | 1.1376 | 3.45 |
| Mesh_4' | 0.22 | 1.1440 | 3.47 |
| Only Ag (without Pd) | 0 | 1.2990 | 3.85 |

Also in the embodiment employing the $SiO_2$ layer, the results relating to the light output and operation is similar to the results shown in FIGS. 5A and 5B. As shown in Table 2, FIGS. 5A and 5B, when the area ratio ($A_{pd}/A_{total}$) is 0.39, the operation voltage is about 3.4 V. Further, referring to FIG. 7B, the operation voltage does not significantly increase up to the area ration ($A_{pd}/A_{total}$) of about 0.4. If the area ratio is below 0.4, the operation voltage is increase sharply. Therefore, the area ratio ($A_{pd}/A_{total}$) should be about 0.4 or more in order to prevent a high operation voltage. Preferably, the area ratio ($A_{pd}/A_{total}$) is 0.9 or less in order to get enough luminance improvement. Most preferably, the area ratio ($A_{pd}/A_{total}$) is from 0.4 to 0.6. As shown in FIGS. 7A and 7B, we can improve the light output power by 13% (at the area of about 0.4) without significant increase in contact resistance.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor light emitting device comprising:
a transparent substrate;
an electron injection layer which is formed on the transparent substrate and formed of N-type GaN-based semiconductor;
an active layer which is formed on a first region of the electron injection layer;
a hole injection layer which is formed on the active layer and formed of P-type GaN-based semiconductor;
a first electrode structure which is formed on the hole injection layer and concurrently providing a high reflectivity and a low contact resistance;
a second electrode structure which is formed on a second region of the electron injection layer; and
a circuit substrate which is electrically connected with the first and second electrode structures,
wherein the first electrode structure comprises a contact metal structure which is mesh- or island-shaped on the hole injection layer to expose a surface portion of the hole injection layer, and a reflective layer which covers the contact metal structure and the exposed surface portion of the hole injection layer, at least an upper portion of the reflective layer being made of silver (Ag) or aluminum (Al),
an area ratio of the contact metal structure to the first electrode structure satisfies a following inequality:

$0.4 \leq A_{pd}/A_{total} < 1$ where $A_{pd}$ is the surface area of the contact metal structure contacting the hole injection layer, and $A_{total}$ is the entire area of the first electrode structure contacting the hole injection layer, and
the first and second electrode structures are flip-chip bonded to the circuit substrate to extract light through the transparent substrate.

2. The light emitting device of claim 1, wherein the area ratio satisfies an inequality of $0.4 \leq A_{pd}/A_{total} \leq 0.9$.

3. The light emitting device of claim 1, wherein the thickness of the contact metal structure is less than 200 nm.

4. The light emitting device of claim 1, wherein the hole injection layer is formed of P-type GaN.

5. The light emitting device of claim 1, wherein the contact metal structure is made of Pd.

6. The light emitting device of claim 1, wherein the reflective layer is made of Ag or Al.

7. The light emitting device of claim 1, wherein the reflective layer comprises a dielectric layer formed on the exposed surface portion of the hole injection layer, and a reflective metal layer made of Ag or Al which covers the contact metal structure and the dielectric layer.

8. The light emitting device of claim 7, wherein the thickness of the dielectric layer is $\lambda/(4n)$, where $\lambda$ is a wavelength of light emitted from the light emitting device and n is a refractive index of the dielectric.

9. The light emitting device of claim 7, wherein the refractive index of the dielectric layer is from 1.1 to 2.3.

10. The light emitting device of claim 7, wherein the dielectric layer is made of $SiO_2$ or $Si_3N_4$.

11. An electrode structure used in a flip-chip GaN-based semiconductor light emitting device having an active layer and a hole injection layer formed on the active layer, the electrode structure being formed on the hole injection layer, the electrode structure comprising:
a contact metal structure which is mesh- or island-shaped on the hole injection layer to expose a surface portion of the hole injection layer; and
a reflective layer which covers the contact metal structure and the exposed surface portion of the hole injection layer, at least an upper portion of the reflective layer being made of silver (Ag) or aluminum (Al),
wherein an area ratio of the contact metal structure to the first electrode structure satisfies a following inequality:

$0.4 \leq A_{pd}/A_{total} < 1$ where $A_{pd}$ is the surface area of the contact metal structure contacting the hole injection layer, and $A_{total}$ is the entire area of the first electrode structure contacting the hole injection layer.

12. The electrode structure of claim 11, wherein the area ratio satisfies an inequality of $0.4 \leq A_{pd}/A_{total} \leq 0.9$.

13. The electrode structure of claim 11, wherein the thickness of the contact metal structure is less than 200 nm.

14. The electrode structure of claim 11, wherein the hole injection layer is formed of P-type GaN.

15. The electrode structure of claim 11, wherein the contact metal structure is made of Pd.

16. The electrode structure of claim 11, wherein the reflective layer is made of Ag or Al.

17. The electrode structure of claim 11, wherein the reflective layer comprises a dielectric layer formed on the exposed surface portion of the hole injection layer, and a reflective metal layer made of Ag or Al which covers the contact metal structure and the dielectric layer.

18. The electrode structure of claim 17, wherein the thickness of the dielectric layer is $\lambda/(4n)$, where $\lambda$ is a wavelength of light emitted from the light emitting device and n is a refractive index of the dielectric.

19. The electrode structure of claim 17, wherein the refractive index of the dielectric layer is from 1.1 to 2.3.

20. The electrode structure of claim 17, wherein the dielectric layer is made of $SiO_2$ or $Si_3N_4$.

* * * * *